US012016133B2

(12) United States Patent
Wu et al.

(10) Patent No.: US 12,016,133 B2
(45) Date of Patent: Jun. 18, 2024

(54) CIRCUIT BOARD WITH A CONDUCTIVE BUMP MOUNTED ON AN ADHESIVE LAYER

(71) Applicant: Unimicron Technology Corp., Taoyuan (TW)

(72) Inventors: Ming-Hao Wu, Taoyuan (TW); Hsuan-Wei Chen, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 845 days.

(21) Appl. No.: 17/083,271

(22) Filed: Oct. 28, 2020

(65) Prior Publication Data
US 2022/0087033 A1 Mar. 17, 2022

(30) Foreign Application Priority Data
Sep. 17, 2020 (TW) .................................. 109132106

(51) Int. Cl.
| H05K 3/40 | (2006.01) |
| H01L 23/00 | (2006.01) |
| H05K 1/02 | (2006.01) |
| H05K 3/00 | (2006.01) |
| H05K 3/42 | (2006.01) |

(52) U.S. Cl.
CPC ........... *H05K 3/4007* (2013.01); *H01L 24/13* (2013.01); *H01L 24/14* (2013.01); *H05K 1/0296* (2013.01); *H05K 3/0094* (2013.01); *H05K 3/421* (2013.01); *H05K 2201/0367* (2013.01)

(58) Field of Classification Search
CPC ....... H01L 24/13; H01L 24/14; H05K 3/4007; H05K 1/0296; H05K 3/0094; H05K 3/421; H05K 2201/0367
See application file for complete search history.

(56) References Cited

U.S. PATENT DOCUMENTS

| 6,528,874 | B1 * | 3/2003 | Iijima | .................... H05K 3/062 174/262 |
| 6,713,687 | B2 * | 3/2004 | Yazaki | ................. H05K 3/4617 257/774 |
| 6,977,348 | B2 * | 12/2005 | Ho | ....................... H05K 3/4617 174/262 |
| 7,721,422 | B2 * | 5/2010 | Iijima | .................. H05K 3/4647 29/874 |

(Continued)

FOREIGN PATENT DOCUMENTS

| CN | 101083238 A | 12/2007 |
| CN | 101360398 A | 2/2009 |

(Continued)

*Primary Examiner* — Alonzo Chambliss
(74) *Attorney, Agent, or Firm* — CKC & Partners Co., LLC

(57) ABSTRACT

A circuit board and a method of manufacturing the same are provided. The method includes the following steps of providing a first conductive layer; providing an adhesive material and at least one conductive bump, in which the adhesive material is electrically conductive; adhering at least one conductive bump to a surface of the first conductive layer using the adhesive material; providing an insulation layer; disposing the insulation layer on the surface of the first conductive layer and at least one conductive bump; and disposing a second conductive layer on the insulation layer.

16 Claims, 10 Drawing Sheets

(56) References Cited

U.S. PATENT DOCUMENTS

| | | | | |
|---|---|---|---|---|
| 8,161,634 | B2* | 4/2012 | Mok | H05K 3/4069 |
| | | | | 156/298 |
| 11,024,561 | B2* | 6/2021 | Shim | H01L 24/11 |
| 2003/0143833 | A1* | 7/2003 | Iijima | H01L 21/486 |
| | | | | 438/622 |
| 2006/0237225 | A1* | 10/2006 | Kariya | H01L 23/49827 |
| | | | | 174/262 |
| 2013/0153269 | A1* | 6/2013 | Takahashi | H05K 3/368 |
| | | | | 174/250 |
| 2014/0103527 | A1* | 4/2014 | Marimuthu | H01L 21/486 |
| | | | | 257/737 |
| 2014/0306339 | A1* | 10/2014 | Ohira | H01L 21/3212 |
| | | | | 257/737 |
| 2015/0245484 | A1* | 8/2015 | Ryu | H01L 23/562 |
| | | | | 156/154 |
| 2016/0037630 | A1* | 2/2016 | Okamoto | H05K 3/4614 |
| | | | | 361/760 |
| 2017/0092631 | A1 | 3/2017 | Standing | |

FOREIGN PATENT DOCUMENTS

| | | |
|---|---|---|
| CN | 104703384 A | 6/2015 |
| KR | 20190092085 A | 8/2019 |
| TW | I482541 B | 4/2015 |
| TW | I542271 B | 7/2016 |
| TW | I560835 B | 12/2016 |

\* cited by examiner

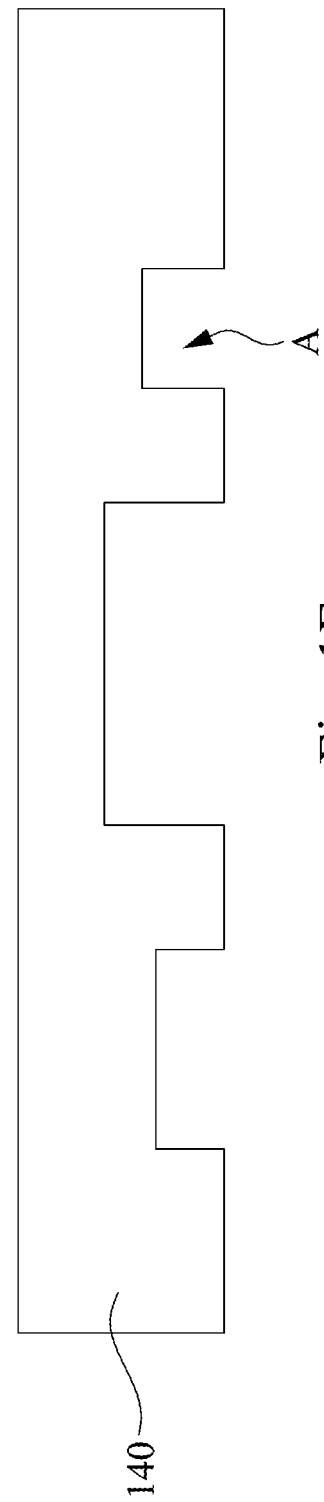

CIRCUIT BOARD WITH A CONDUCTIVE BUMP MOUNTED ON AN ADHESIVE LAYER

CROSS-REFERENCE TO RELATED APPLICATION

This application claims priority to Taiwan Application Serial Number 109132106, filed Sep. 17, 2020, which is herein incorporated by reference.

BACKGROUND

Field of Invention

The present disclosure relates to a circuit board and a manufacturing method thereof. Specifically, the present disclosure relates to a circuit board with an embedded conductive bump and a manufacturing method thereof.

Description of Related Art

In current, there are primarily two methods for manufacturing a circuit board with embedded conductive bumps (partially thickening). One method is to provide a conductive layer by electroplating. The other method is to first form a through hole in an insulation layer of a substrate, and then filling the through hole with a conductive material, followed by forming a conductive layer on the upper surface and the lower surface of the insulation layer and the conductive material filled in the through hole.

However, there are some limitations on the thickness of the electroplated layer in the first method, such as the inability to form a conductive bump structure with a thickness greater than 200 micrometers. The second method is limited by the thickness of the conventional substrate, such that the thickness of conductive bump is limited. Therefore, in the current methods of manufacturing embedded conductive bumps, the increase in the thickness of conductive bumps is limited.

In addition, in the second method, if there is a need to further pattern the conductive layer to form traces, the patterning area has to bypass the area filled with the conductive material, such that the design flexibility of the trace pattern is limited.

Therefore, how to achieve the flexibility to adjust the thickness of the conductive bump embedded in the circuit board and also to increase the flexibility of the patterning area of the conductive layer are urgent problems to be solved.

SUMMARY

One aspect of the present disclosure is a circuit board including a first conductive layer, at least one adhesive layer, at least one conductive bump, an insulation layer, and a second conductive layer. The at least one adhesive layer is disposed on a surface of the first conductive layer and is electrically conductive. The at least one conductive bump includes a top surface and a bottom surface opposite to the top surface, in which the bottom surface is in contact with the at least one adhesive layer and is adhered on the first conductive layer via the at least one adhesive layer. The insulation layer covers the surface of the first conductive layer and the at least one conductive bump. The second conductive layer is disposed on the insulation layer.

In some embodiments, a thickness ratio of the first conductive layer to a total thickness of the first conductive layer, the at least one adhesive layer and the at least one conductive bump is greater than 1:15.

In some embodiments, a total thickness of the first conductive layer, the at least one adhesive layer and the at least one conductive bump ranges from 20 micrometers to 3 millimeters.

In some embodiments, a thickness of the first conductive layer is greater than 3 micrometers.

In some embodiments, a thickness of the at least one adhesive layer is less than 5 micrometers.

In some embodiments, a surface area of the bottom surface of the at least one conductive bump that the at least one adhesive layer is in contact with is not beyond a surface area of the bottom surface of the at least one conductive bump.

In some embodiments, the circuit board further includes a plurality of conductive bumps different in sizes, shapes, or both.

In some embodiments, the circuit board further includes at least one conductive column penetrating the second conductive layer and the insulation layer and extending to the top surface of the at least one conductive bump.

In some embodiments, the at least one conductive column has a top portion coplanar with the second conductive layer.

In some embodiments, the at least one conductive column is one conductive column, the at least one conductive bump is one conductive bump, and the conductive column is located on the conductive bump.

In some embodiments, the at least one conductive column is a plurality of conductive columns, the at least one conductive bump is one conductive bump, and the plurality of conductive columns are located on the conductive bump.

In some embodiments, the first conductive layer is a first patterned conductive layer, the second conductive layer is a second patterned conductive layer or combinations thereof.

In some embodiments, a material of the at least one adhesive layer includes metal particles.

One aspect of the present disclosure is a method of manufacturing circuit board, including steps of: providing a first conductive layer; providing an adhesive material and at least one conductive bump, in which the adhesive material is electrically conductive; adhering the at least one conductive bump on a surface of the first conductive layer via the adhesive material; providing an insulation layer; disposing the insulation layer on the surface of the first conductive layer and the at least one conductive bump; and disposing a second conductive layer on the insulation layer.

In some embodiments, the step of adhering the at least one conductive bump on the surface of the first conductive layer via the adhesive material includes heating the adhesive material to a fluid state, and then adhering the at least one conductive bump on the surface of the first conductive layer via the adhesive material.

In some embodiments, the step of disposing the insulation layer on the surface of the first conductive layer and the at least one conductive bump includes removing a portion of the insulation layer to form at least one recess indented inward; covering and accommodating the at least one conductive bump in the at least one recess; and laminating the insulation layer, the at least one conductive bump and the first conductive layer.

In some embodiments, the method further includes forming at least one conductive column penetrating the second conductive layer and the insulation layer and extending to a top surface of the at least one conductive bump.

In some embodiments, the step of forming the at least one conductive column includes removing a portion of the insulation layer and a portion of the second conductive layer to expose the top surface of the at least one conductive bump, thereby forming at least one blind hole; and filling up the at least one blind hole with a conductive material, such that the conductive material is in contact with the second conductive layer to form the at least one conductive column.

In some embodiments, after the step of disposing the second conductive layer on the insulation layer, the method further includes patterning the first conductive layer and the second conductive layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

FIG. 1A to FIG. 1G exemplarily illustrate a process of manufacturing a circuit board according to some embodiments of the present disclosure.

DETAILED DESCRIPTION

Figure 1A:
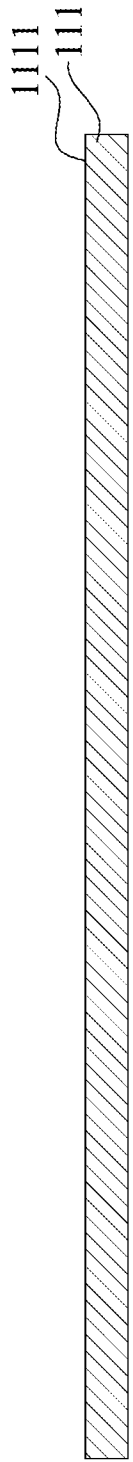

It is understood that the following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used herein have a general meaning in the field and the context in which they are used. The use of examples anywhere in this specification including examples of any terms discussed herein is illustrative only, and in no way limits the scope and meaning of the invention or of any exemplified term. Likewise, the invention is not limited to various embodiments given in this specification.

It is understood that although the terms first, second, etc. may be used herein to describe various elements, these elements shall not be limited by these terms. These terms are only used to distinguish one element from another element. For example, without departing from the scope of the present embodiment, a first element may be termed as a second element. Similarly, a second element may be termed as a first element.

As used herein, the term "and/or" includes any and all combinations of one or more of the associated listed items.

As used herein, the term "comprise," "include," and "having" are to be construed in an open, inclusive sense, that is, as "including, but not limited to."

FIG. 1A to FIG. 1G exemplarily illustrate a process of manufacturing a circuit board according to some embodiments of the present disclosure.

First, refer to FIG. 1A, a first conductive layer 111 is provided. In some embodiments, the first conductive layer 111 is metal, such as copper (copper foil), but is not limited thereto. In some embodiments, a thickness of the first conductive layer is greater than 3 micrometers, such as 3 micrometers to 10 micrometers (3 micrometers, 4 micrometers, 5 micrometers, 6 micrometers, 7 micrometers, 8 micrometers, 9 micrometers, or 10 micrometers), but is not limited thereto.

Figure 1B:
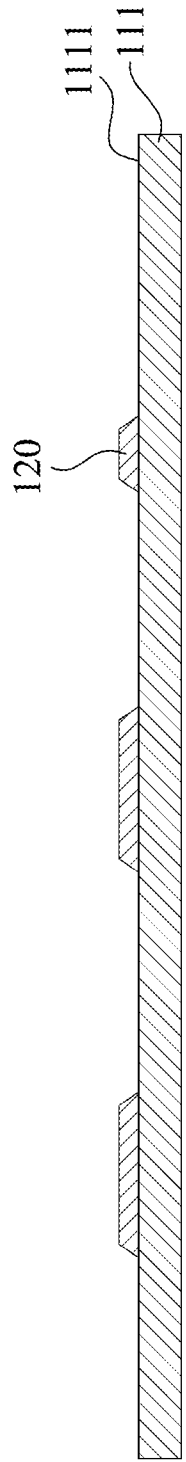
Figure 1C:
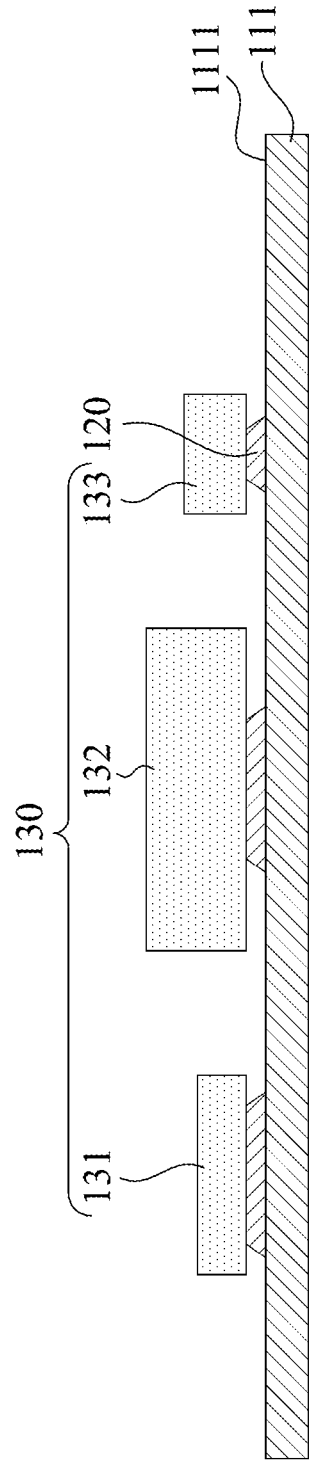

Next, refer to FIG. 1B and FIG. 1C, an adhesive material which is electrically conductive is coated on a surface 1111 of the first conductive layer 111 to form an adhesive layer 120, and a plurality of conductive bumps 130 are adhered to the surface 1111 of the first conductive layer 111. In some embodiments, the adhesive material may also be first coated on a bottom surface of the conductive bump 130, and the conductive bumps 130 are then adhered to the surface 1111 of the first conductive layer 111.

In some embodiments, a surface area of the bottom surface of the conductive bump 130 that the adhesive layer 120 is in contact with is not beyond a surface area of the bottom surface of the conductive bumps 130. In other words, the adhesive layer 120 is within the bottom surface of the conductive bump 130. In some embodiments, the adhesive material includes a conductive paste having a conductive substance, such as a transient liquid phase sintering (TLPS) adhesive material. The TLPS adhesive material includes combinations of metal particles (such as copper and tin) and a solvent. The principle is to heat a combination of metal particles that can form a liquid phase at the adhesion interface so as to become a fluid state at the interface. As the reaction and diffusion proceed, the melting point of the liquid phase gradually rises, such that the melting point of the adhesive layer 120 exceeds the adhesion temperature. The adhesive layer 120 is then cured and thereby adhered to the first conductive layer 111. The adhesive layer 120 made from the TLPS adhesive material has not only high reliability but also low resistance (i.e., an excellent electrical conductivity, where the resistivity may be less than $1\times10^{-6}$ $\Omega\cdot m$) and high thermal conductivity (the thermal conductivity is greater than 20 W/mK), can conduct between the conductive bumps 130 and the first conductive layer 111, and assists the heat dissipation of the conductive bumps 130. In one embodiment, by means of heating the TLPS adhesive material to above 150° C. and below the melting points of the first conductive layer 111 and the conductive bump 130 (such as 160° C., 170° C., 180° C., 190° C., or 200° C., but is not limited thereto), the TLPS adhesive material can become liquid and in a fluid state. In one embodiment, a thickness of the adhesive layer 120 is less than 5 micrometers, such as 0.01 micrometers to 5 micrometers, such as 1 micrometer, 2 micrometers, 3 micrometers, 4 micrometers, or any value in the aforementioned interval, but is not limited thereto.

In some embodiments, the size and shape of the conductive bumps 130 are not limited. In one embodiment, the conductive bumps 130 may have the same size or the same shape. In another embodiment, the conductive bumps 130 may have different sizes or shapes (for example, a first conductive bump 131, a second conductive bump 132 and a third conductive bump 133 shown in FIG. 1C). In one embodiment, the conductive bumps 130 may be a long, narrow strip extending structure, such as a conductive pad or trace.

In some embodiments, a total thickness of the first conductive layer 111, the adhesive layer 120 and the conductive bump 130 may range from 20 micrometers to 3 millimeters, such as 20 micrometers, 40 micrometers, 60 micrometers, 80 micrometers, 100 micrometers, 200 micrometers, 400 micrometers, 600 micrometers, 800 micrometers, 1 millimeter, 2 millimeters, 3 millimeters, or any value in the aforementioned intervals, but is not limited thereto. It is noted that by means of using the adhesive layer 120 and adhering the conductive bump 130 to the first conductive layer 111 before bonding to other components, the conductive bump 130 is not limited by the thickness of the conventional circuit board, thereby providing more flexible applications of the circuit board structure having embedded conductive bump 130. For example, in some embodiments, the conductive bump 130 with a larger thickness can be used, such that a thickness ratio of the thickness of the first conductive layer 111 to a total thickness of the first conductive layer 111, the adhesive layer 120 and the conductive bump 130 is greater than 1:15, such as 1:15 to 1:30 (for example, 1:16, 1:17, 1:18, 1:19, 1:20, 1:21, 1:22, 1:23, 1:24, 1:25, 1:26, 1:27, 1:28, 1:29, 1:30, or any ratio in the aforementioned interval), but is not limited thereto.

Figure 1F:
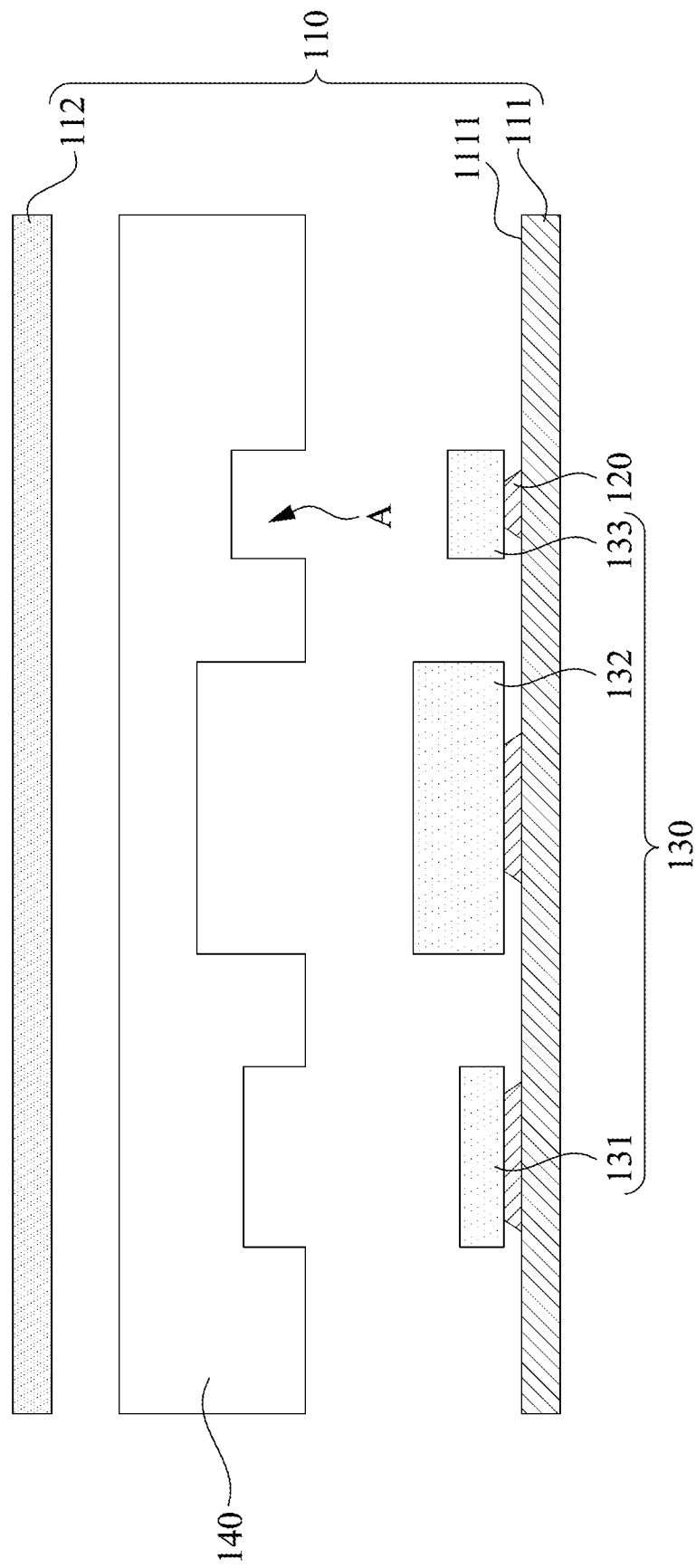
Figure 1G:
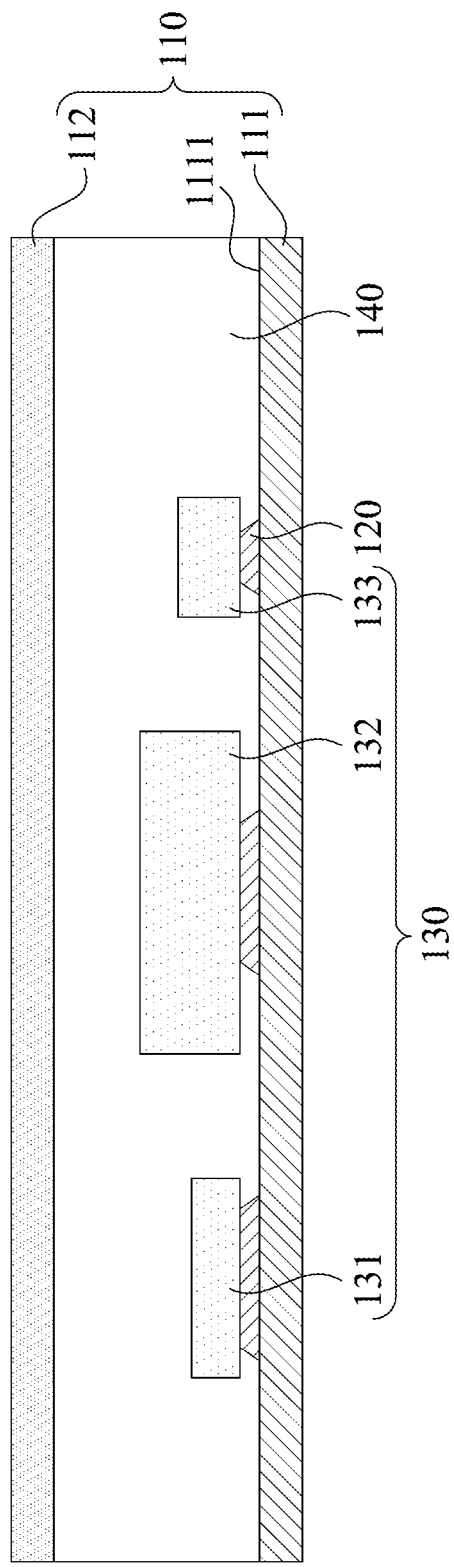

Subsequently, reference is invited to FIG. 1D to FIG. 1G. In FIG. 1D, an insulation layer 140 is provided. In FIG. 1E, a portion of the insulation layer 140 is removed, such that a plurality of recesses A which are indented inward and can accommodate the conductive bumps 130 are formed at a surface of the insulation layer 140. In FIG. 1F and FIG. 1G, the insulation layer 140 is disposed on the surface 1111 of the first conductive layer 111 and the conductive bumps 130, such that the conductive bumps 130 are accommodated in the recesses A. Meanwhile, a second conductive layer 112 is provided and is disposed on the insulation layer 140 to form a circuit board 100.

In some embodiments, the materials and the thickness of the second conductive layer 112 may be the same as or similar to those of the first conductive layer 111.

In some other embodiments, in the step of disposing the insulation layer 140 on the surface 1111 of the first conductive layer 111 and the conductive bump 130, the recesses A that can accommodate the conductive bumps 130 may be first formed on a first insulation layer. The conductive bump 130 and the first conductive layer 111 are then covered by the first insulation layer having the recesses A, such that the conductive bumps 130 are accommodated in the recesses A. Subsequently, based on the desired thickness of the insulation layer 140, one or more layers of second insulation layer without recesses is disposed on the first insulation layer having the recess A. Finally, the second conductive layer 112 is disposed on the second insulation layer or the topmost second insulation layer to form the circuit board 100. In some embodiments, the step of disposing the insulation layer 140 on the surface 1111 of the first conductive layer 111 and the conductive bump 130 and the step of disposing the second conductive layer 112 on the insulation layer 140 both include using thermal lamination to simultaneously laminate the first conductive layer 111, the insulation layer 140, the conductive bumps 130 and the second conductive layer 112 to form the circuit board 100. The first conductive layer 111, the conductive bumps 130, the adhesive layer 120 and the second conductive layer 112 are electrically conductive and electrically connected to each other to form a conductive structure.

Figure 2A:
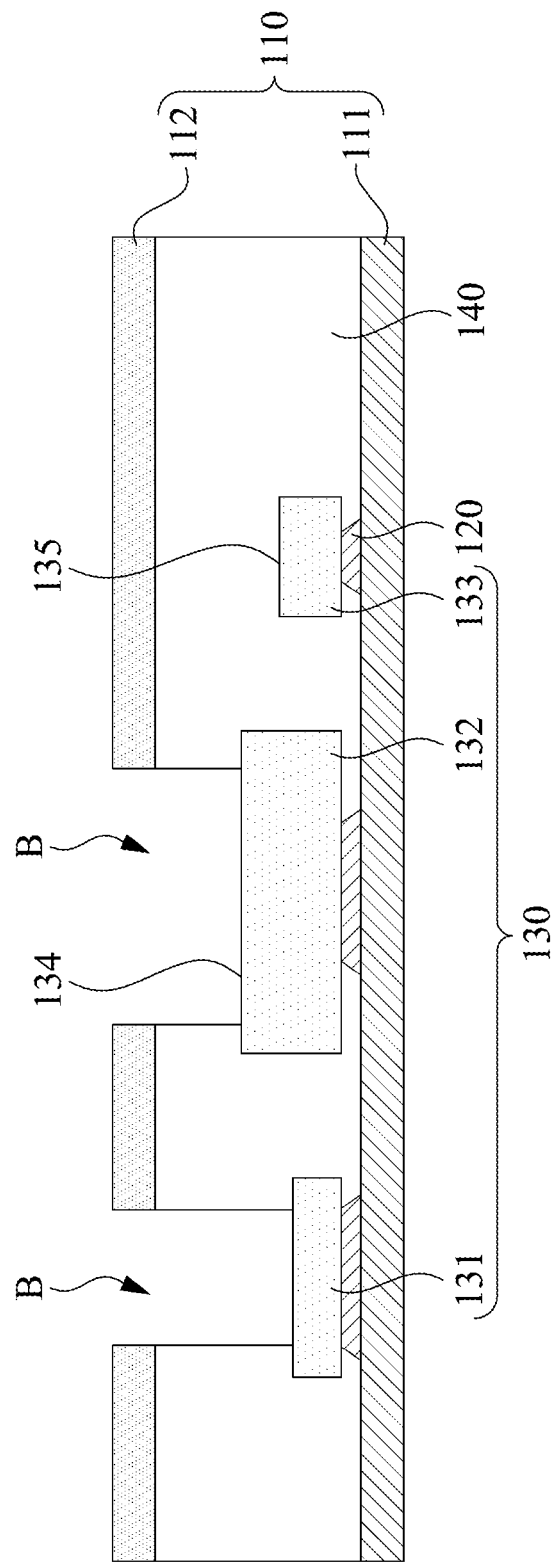
FIG. 2A to FIG. 2B exemplarily illustrate a process of manufacturing a circuit board having a conductive column according to some embodiments of the present disclosure.
Figure 2B:
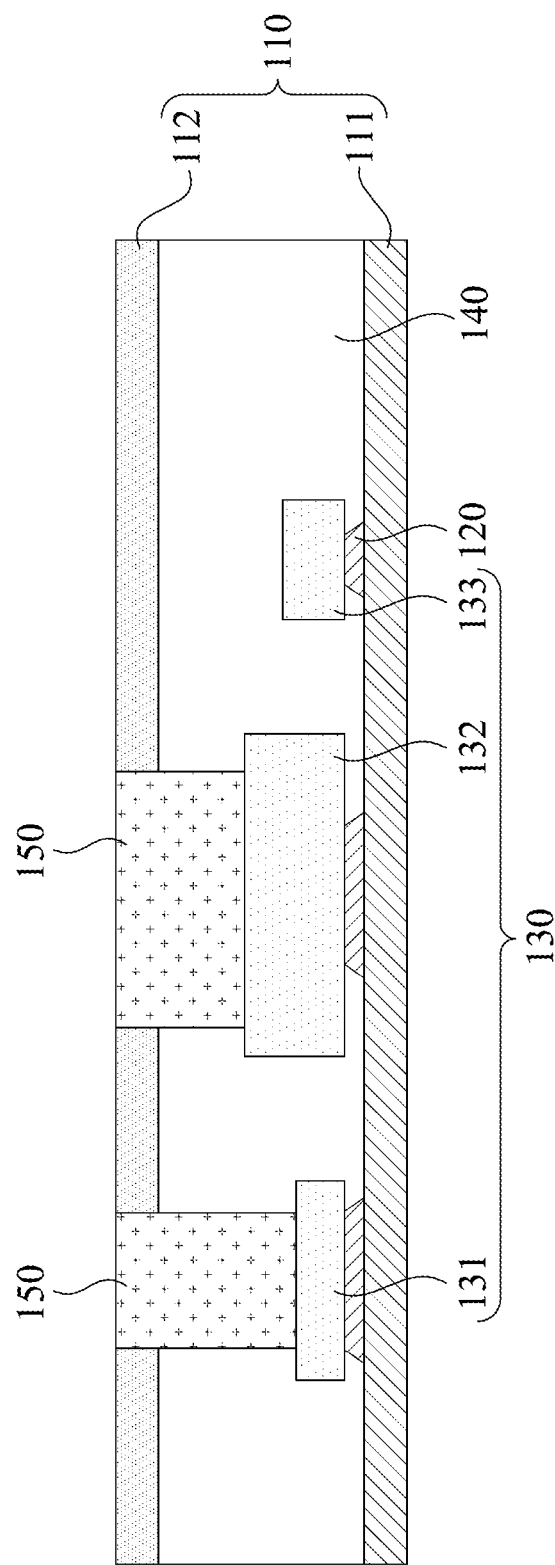

Reference is made to FIG. 2A to FIG. 2B, which exemplarily illustrates a process of manufacturing a circuit board having a conductive column 150 according to some embodiments of the present disclosure.

First, refer to FIG. 2A, a portion of the insulation layer 140 and a portion of the second conductive layer 112 are removed to expose top surfaces 134 of the conductive bumps 130, thereby forming a plurality of blind holes B. Next, refer to FIG. 2B, the blind holes B are filled with a conductive material to form a plurality of conductive columns 150. In other words, the conductive columns 150 penetrate the second conductive layer 112 and the insulation layer 140 and extend to the top surfaces 134 of the conductive bumps 130. In some embodiments, there is no conductive column 150 on top surfaces (for example, a top surface 135) of some of the conductive bumps 130 (for example, the third conductive bump 133).

In some embodiments, the conductive material may have the same material as that of the conductive layer 110, such as copper. In some embodiments, the blind holes B may be formed by using laser or selective etching, followed by using the second conductive layer 112 as an electroplating seed layer and filling the conductive material in the blind holes B to form the conductive columns 150. In some embodiments, the conductive columns 150 have top portions coplanar with the second conductive layer 112.

The conductive column 150 is used to assist the heat dissipation of the conductive bump 130. For those skilled in the art, one or more conductive column 150 can selectively formed on the conductive bump 130 based on considerations of heat dissipation requirements, cost, subsequent manufacturing process, etc.

Figure 3A:
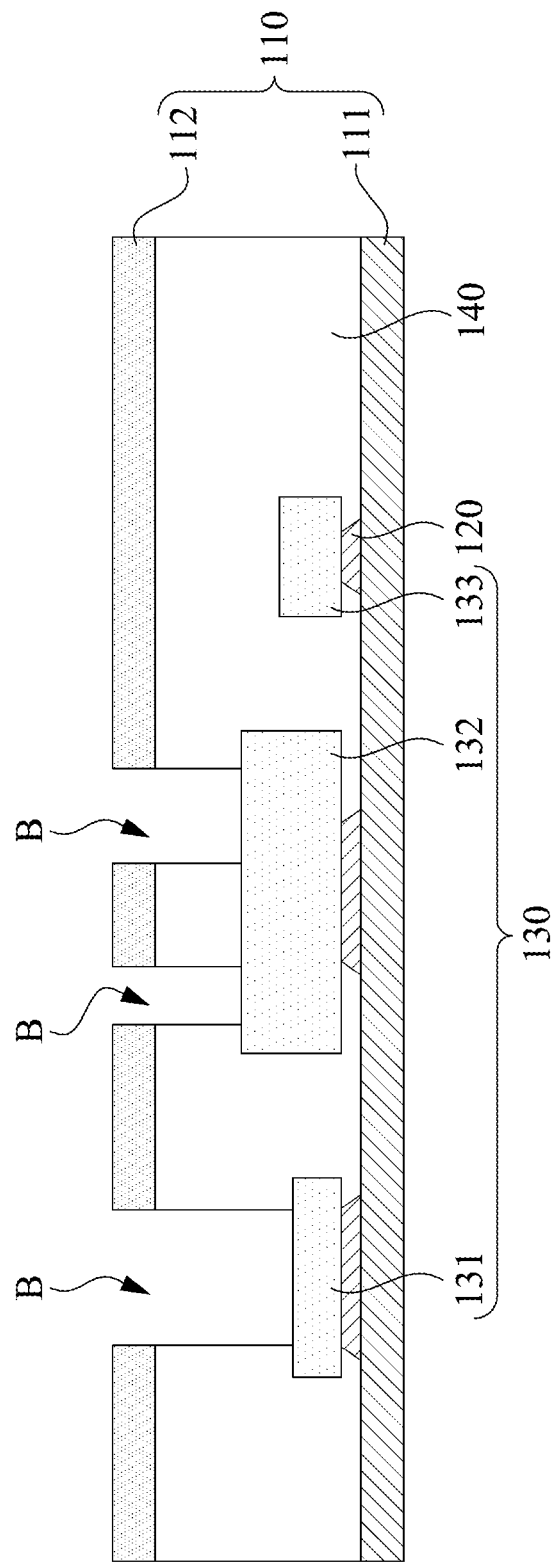
FIG. 3A to FIG. 3B exemplarily illustrate a process of manufacturing a circuit board having a conductive column according to other embodiments of the present disclosure.
Figure 3B:
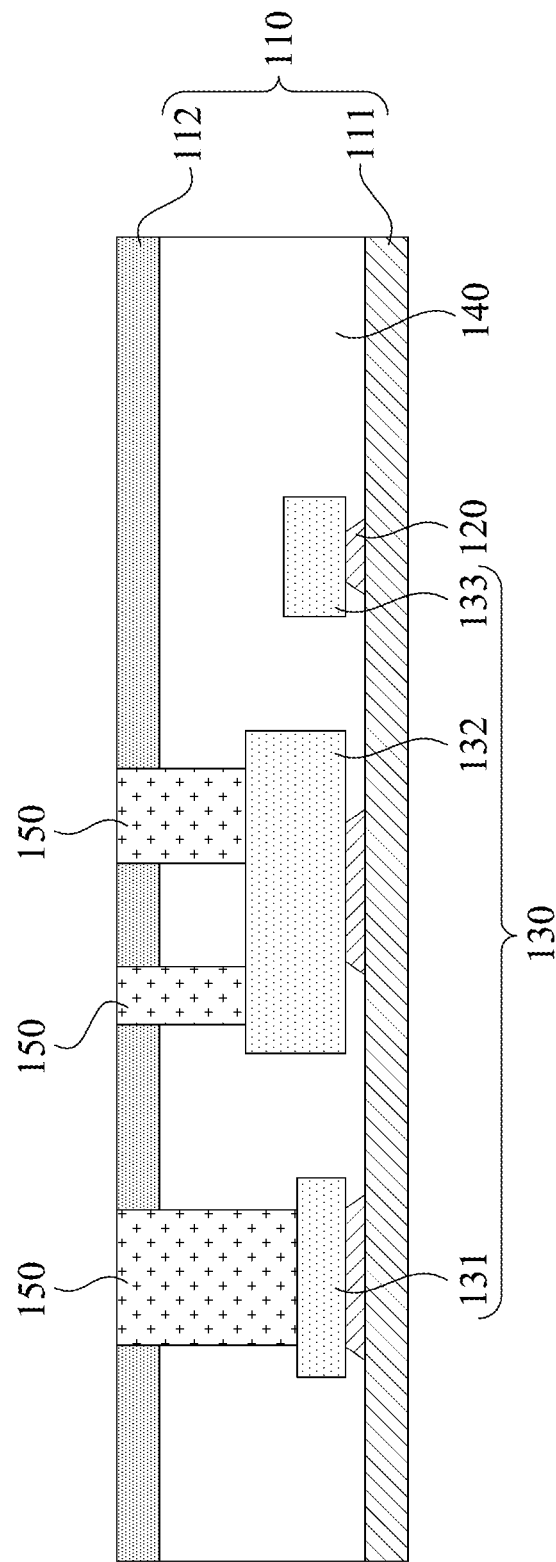

In some embodiments, refer to FIG. 3A to FIG. 3B, which exemplarily illustrates a process of manufacturing a circuit board 100 having at least one conductive column 150 according to other embodiments of the present disclosure, and an aspect where multiple conductive columns 150 are formed on one conductive bump 130 is further included, in addition to the aspect where one conductive column 150 is formed on one conductive bump 130. The purpose is to increase the heat dissipation area of the conductive bumps 130 which are prone to generate heat in use. FIG. 3A exemplarily illustrates one blind hole B formed on the first conductive bump 131 and two blind holes B formed on the second conductive bump 132. FIG. 3B exemplarily illustrates multiple conductive columns 150 are formed by filling the blind holes B with the conductive material. In some embodiments, the method of forming the blind holes B and the conductive columns 150 in FIG. 3A and FIG. 3B may be similar to the method described with respect to FIG. 2A and FIG. 2B.

In other words, the circuit board 100 in the present disclosure may include various aspects, including one conductive column 150 disposed on one conductive bump 130, a plurality of conductive columns 150 disposed on one conductive bump 130, no conductive column 150 disposed on the conductive bump 130, or aspects including any two or more of the aforementioned arrangements.

Figure 4:
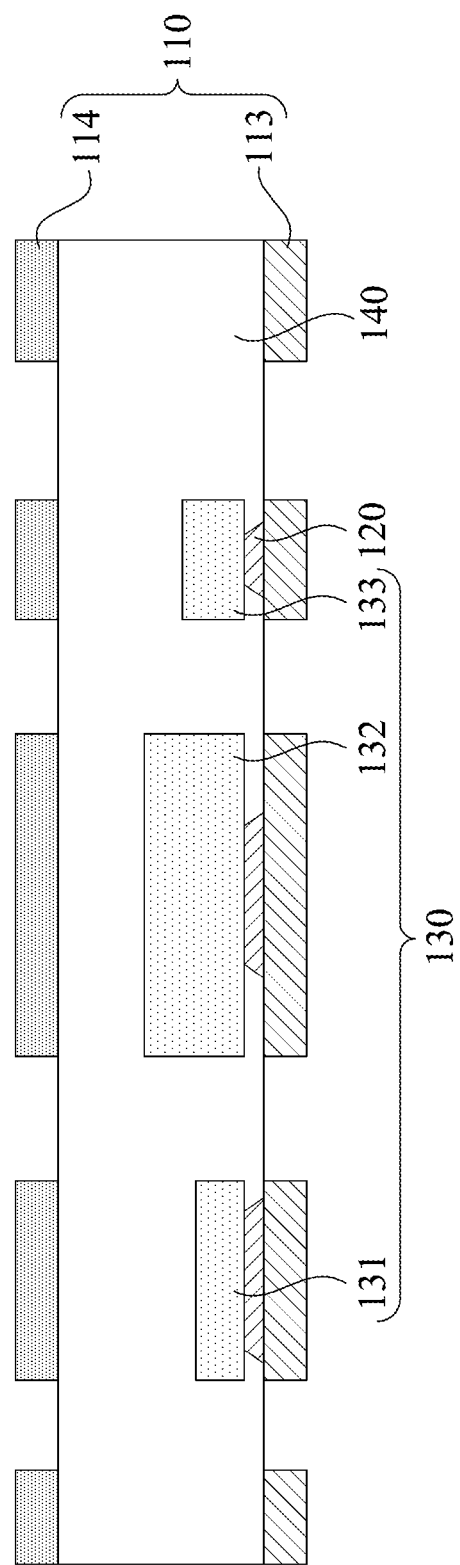
FIG. 4 exemplarily illustrates a process of manufacturing a circuit board having traces according to some embodiments of the present disclosure.

In some embodiments, refer to FIG. 4, either the first conductive layer 111 or the second conductive layer 112 (or both) may be patterned by using lithography and etching to form a first patterned conductive layer 113 or a second patterned conductive layer 114 (or both) to serve as traces.

Figure 5:
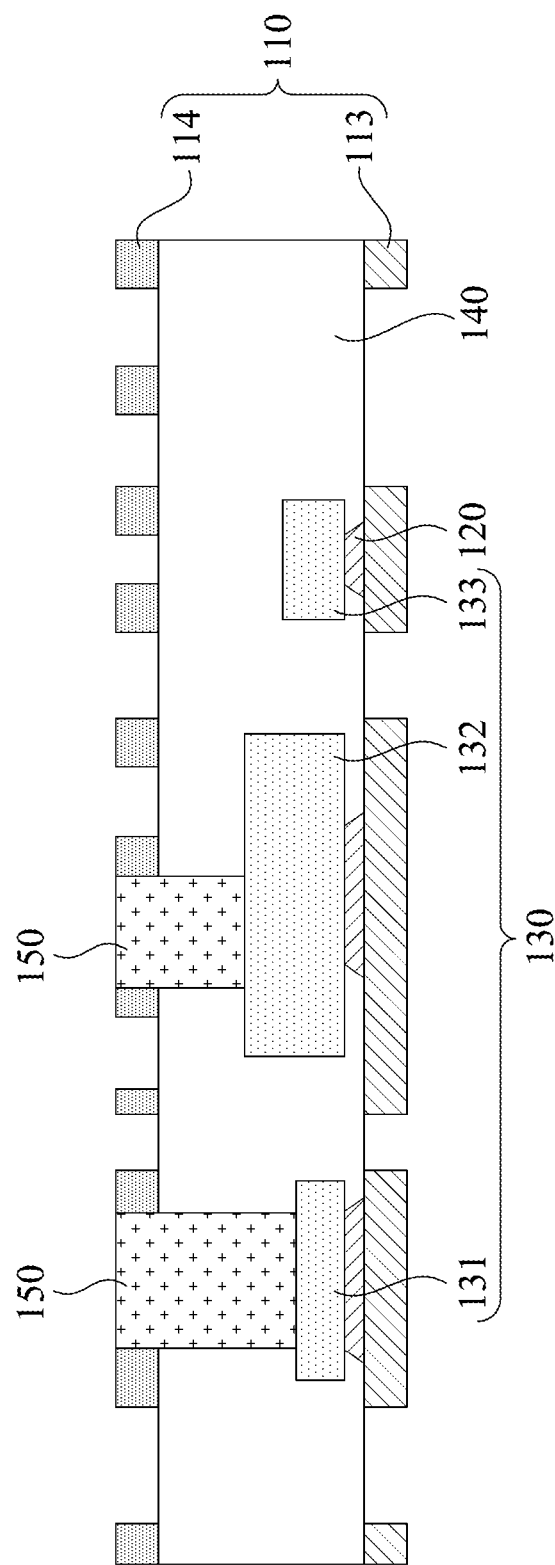
FIG. 5 exemplarily illustrates a process of manufacturing a circuit board having traces and a conductive column according to some embodiments of the present disclosure.

For example, the first conductive layer 111 and the second conductive layer 112 in the circuit board 100 having the conductive bump 130 may be further patterned to form the first patterned conductive layer 113 and the second patterned conductive layer 114. Alternatively, refer to FIG. 5, the first conductive layer 111 and the second conductive layer 112 in the circuit board 100 having the conductive bump 130 and the conductive column 150 may be further patterned. In some embodiments of the present disclosure, it is noted that the conductive bumps 130 do not penetrate the insulation layer 140 and the second conductive layer 112, and some of the conductive bumps 130 are not provided with the conductive column 150 thereon (for example, the third conductive bump 133). Thus, the process of patterning the second conductive layer 112 is not limited by the position of the conductive bumps 130.

In the circuit board and the method of manufacturing the same as disclosed in some embodiments of the present disclosure, a conductive adhesive material is used to bond a conductive layer to conductive bumps. Compared with the prior arts where the conductive bump is formed on the conductive layer by electroplating or filling through holes of an insulation layer in the substrate with a conductive material, the thickness of the conductive bump in the present disclosure can be free from the limitations imposed by the substrate or electroplating, has improved flexibility, and is also free from the limitations which the patterning position of the conductive layer has to bypass the position of the conductive bump, thereby providing more varieties of design alteration for the trace pattern.

Although the present invention has been described in considerable detail referring to certain embodiments thereof, other embodiments are possible. Therefore, the spirit and scope of the appended claims should not be limited to the description of the embodiments contained herein.

What is claimed is:

1. A circuit board, comprising:
    a first conductive layer;
    at least one adhesive layer disposed on a surface of the first conductive layer, wherein the at least one adhesive layer is electrically conductive, and a material of the at least one adhesive layer comprises metal particles;
    at least one conductive bump comprising a top surface and a bottom surface opposite to the top surface, wherein the bottom surface is in contact with the at least one adhesive layer and is adhered on the first conductive layer via the at least one adhesive layer;
    an insulation layer covering the surface of the first conductive layer and the at least one conductive bump;
    a second conductive layer disposed on the insulation layer; and at least one conductive column penetrating the second conductive layer and the insulation layer and extending to the top surface of the at least one conductive bump.

2. The circuit board of claim 1, wherein a thickness ratio of the first conductive layer to a total thickness of the first conductive layer, the at least one adhesive layer and the at least one conductive bump is greater than 1:15.

3. The circuit board of claim 1, wherein a total thickness of the first conductive layer, the at least one adhesive layer and the at least one conductive bump ranges from 20 micrometers to 3 millimeters.

4. The circuit board of claim 1, wherein a thickness of the first conductive layer is greater than 3 micrometers.

5. The circuit board of claim 1, wherein a thickness of the at least one adhesive layer is less than 5 micrometers.

6. The circuit board of claim 1, wherein a surface area of the bottom surface of the at least one conductive bump that the at least one adhesive layer is in contact with is not beyond a surface area of the bottom surface of the at least one conductive bump.

7. The circuit board of claim 1, further comprising a plurality of conductive bumps different in sizes, shapes, or both.

8. The circuit board of claim 1, wherein the at least one conductive column has a top portion coplanar with the second conductive layer.

9. The circuit board of claim 1, wherein the at least one conductive column is one conductive column, the at least one conductive bump is one conductive bump, and the conductive column is located on the conductive bump.

10. The circuit board of claim 1, wherein the at least one conductive column is a plurality of conductive columns, the at least one conductive bump is one conductive bump, and the plurality of conductive columns are located on the conductive bump.

11. The circuit board of claim 1, wherein the first conductive layer is a first patterned conductive layer, the second conductive layer is a second patterned conductive layer or combinations thereof.

12. A method of manufacturing circuit board, comprising steps of:
    providing a first conductive layer;
    providing an adhesive material and at least one conductive bump, wherein the adhesive material is electrically conductive and comprises metal particles;
    adhering the at least one conductive bump on a surface of the first conductive layer via the adhesive material;
    providing an insulation layer;
    disposing the insulation layer on the surface of the first conductive layer and the at least one conductive bump, comprising:
        removing a portion of the insulation layer to form at least one recess indented inward;
        covering and accommodating the at least one conductive bump in the at least one recess; and
        laminating the insulation layer, the at least one conductive bump and the first conductive layer; and
    disposing a second conductive layer on the insulation layer.

13. The method of claim 12, wherein the step of adhering the at least one conductive bump on the surface of the first conductive layer via the adhesive material comprises heating the adhesive material to a fluid state and then adhering the at least one conductive bump on the surface of the first conductive layer via the adhesive material.

14. The method of claim 12, further comprising forming at least one conductive column penetrating the second conductive layer and the insulation layer and extending to a top surface of the at least one conductive bump.

15. The method of claim 14, wherein the step of forming the at least one conductive column comprises:
    removing a portion of the insulation layer and a portion of the second conductive layer to expose the top surface of the at least one conductive bump, thereby forming at least one blind hole; and filling up the at least one blind hole with a conductive material, such that the conductive material is in contact with the second conductive layer to form the at least one conductive column.

16. The method of claim 12, after the step of disposing the second conductive layer on the insulation layer, further comprising patterning the first conductive layer and the second conductive layer.

* * * * *